United States Patent
Mao et al.

(10) Patent No.: US 12,255,155 B2
(45) Date of Patent: *Mar. 18, 2025

(54) PACKAGE STRUCTURE WITH STACKED SEMICONDUCTOR DIES

(71) Applicant: Taiwan Semiconductor Manufacturing Company, Ltd., Hsinchu (TW)

(72) Inventors: Yi-Chao Mao, Zhongli (TW); Chin-Chuan Chang, Zhudong Township (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 449 days.

This patent is subject to a terminal disclaimer.

(21) Appl. No.: 17/587,290

(22) Filed: Jan. 28, 2022

(65) Prior Publication Data

US 2022/0157743 A1    May 19, 2022

Related U.S. Application Data

(63) Continuation of application No. 16/227,449, filed on Dec. 20, 2018, now Pat. No. 11,239,180.

(60) Provisional application No. 62/711,929, filed on Jul. 30, 2018.

(51) Int. Cl.
*H01L 23/00* (2006.01)
*H01L 21/768* (2006.01)

(52) U.S. Cl.
CPC ...... *H01L 23/562* (2013.01); *H01L 21/76816* (2013.01); *H01L 24/08* (2013.01); *H01L 24/17* (2013.01); *H01L 24/32* (2013.01); *H01L 2224/02333* (2013.01); *H01L 2224/83203* (2013.01)

(58) Field of Classification Search
CPC . H01L 23/562; H01L 21/76816; H01L 24/08; H01L 24/17; H01L 24/32
USPC .................................................... 257/690
See application file for complete search history.

(56) References Cited

U.S. PATENT DOCUMENTS

| | | |
|---|---|---|
| 8,619,431 B2 | 12/2013 | Lin et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 8/2015 | Hung et al. |
| 9,111,949 B2 | 8/2015 | Yu et al. |
| 9,263,511 B2 | 2/2016 | Yu et al. |

(Continued)

*Primary Examiner* — Jasmine J Clark
(74) *Attorney, Agent, or Firm* — Birch, Stewart, Kolasch & Birch, LLP

(57) ABSTRACT

A package structure is provided. The package structure includes a lower semiconductor die and a first protective layer surrounding the lower semiconductor die. The package structure also includes a dielectric layer partially covering the first protective layer and the lower semiconductor die and an upper semiconductor die over the lower semiconductor die and the first protective layer. The upper semiconductor die is bonded with the lower semiconductor die through a connector. The package structure further includes an insulating film surrounding the connector and a second protective layer surrounding the upper semiconductor die. A portion of the second protective layer is between the insulating film and the dielectric layer.

20 Claims, 11 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,620,465 B1 | 4/2017 | Pan et al. |
| 11,239,180 B2 * | 2/2022 | Mao ................. H01L 21/561 |
| 2018/0076179 A1 * | 3/2018 | Hsu ................... H01L 21/56 |

* cited by examiner

PACKAGE STRUCTURE WITH STACKED SEMICONDUCTOR DIES

PRIORITY CLAIM AND CROSS-REFERENCE

This application is a Continuation application of U.S. patent application Ser. No. 16/227,449, filed on Dec. 20, 2018, now U.S. Pat. No. 11,239,180, which claims the benefit of U.S. Provisional Application No. 62/711,929, filed on Jul. 30, 2018, the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
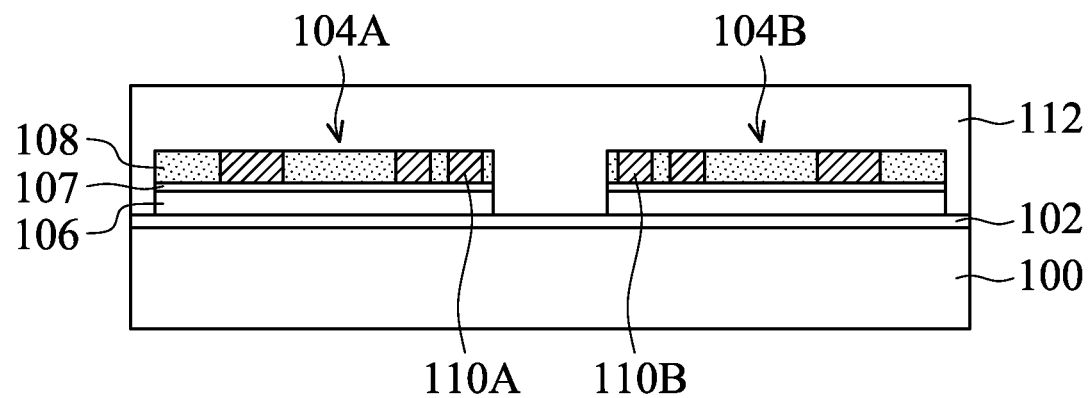
FIGS. 1A-1J are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are cross-sectional views of various stages of a process for forming a package structure, in accordance with some embodiments. As shown in FIG. 1A, semiconductor dies 104A and 104B are attached or placed over a carrier substrate 100, in accordance with some embodiments. An adhesive layer 102 may be used to affix the semiconductor dies 104A and 104B.

Each of the semiconductor dies 104A and 104B includes a semiconductor substrate 106 and an interconnection structure 107 formed on the semiconductor substrate 106. The interconnection structure 107 includes multiple interlayer dielectric layers and multiple conductive features formed in the interlayer dielectric layers. These conductive features include conductive lines, conductive vias, and/or conductive contacts. Some portions of the conductive features may be used as conductive pads.

In some embodiments, various device elements are formed in and/or on the semiconductor substrate 106. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, light sensors, one or more other suitable elements, or a combination thereof.

The device elements are interconnected through the interconnection structure 107 to form integrated circuit devices. The integrated circuit devices include logic devices, memory devices (e.g., static random access memories, SRAMs), radio frequency (RF) devices, input/output (I/O) devices, system-on-chip (SoC) devices, logic devices, one or more other applicable types of devices, or a combination thereof.

In some embodiments, the semiconductor die 104A further includes conductive features 110A, and the semiconductor die 104B further includes conductive features 110B. The conductive features 110A and 110B may include metal pillars. In some embodiments, each of the conductive features 110A and 110B has a vertical sidewall. The conductive features 110A and 110B may be made of or include copper, titanium, cobalt, gold, platinum, one or more other suitable materials, or a combination thereof. The conductive features 110A and 110B may be formed using an electroplating process, a physical vapor deposition (PVD) process, a chemical vapor deposition (CVD) process, one or more other applicable processes, or a combination thereof.

In some embodiments, each of the semiconductor dies 104A and 104B further includes a passivation layer 108. The passivation layer 108 is used to protect the interconnection structure 106 and the device elements thereunder. The passivation layer 108 may include openings that expose the conductive features 110A and 110B. The passivation layer 108 may be made of or include polyimide (PI), poly-p-phenylenebenzobisthiazole (PBO), silicon nitride, silicon oxynitride, one or more other suitable materials, or a combination thereof. The passivation layer 108 may be formed using a spin coating process, a CVD process, a spray coating process, one or more other applicable processes, or a combination thereof. A patterning process may be used to make to passivation layer 108 with desired patterns.

Afterwards, a protective layer 112 is formed over the carrier substrate 100, as shown in FIG. 1A in accordance with some embodiments. The protective layer 112 surrounds and covers the semiconductor dies 104A and 104B. The protective layer 112 may be made of or include a molding material (or a molding compound material). The molding material may include an epoxy-based resin with fillers dispersed therein. The fillers may include fibers (such as silica fibers), particles (such as silica particles), or a combination thereof. The protecting layer 112 may be formed using an injecting process, a spin coating process, a spray coating process, one or more other applicable processes, or a combination thereof.

Many variations and/or modifications can be made to embodiments of the disclosure. In some other embodiments, the protective layer 112 is made of or includes silicon oxide, silicon oxynitride, silicon nitride, silicon carbide, one or more other suitable materials, or a combination thereof. In these cases, the protective layer 112 may be deposited using a CVD process, a spin-coating process, a spray coating process, one or more other applicable processes, or a combination thereof.

Figure 1B:
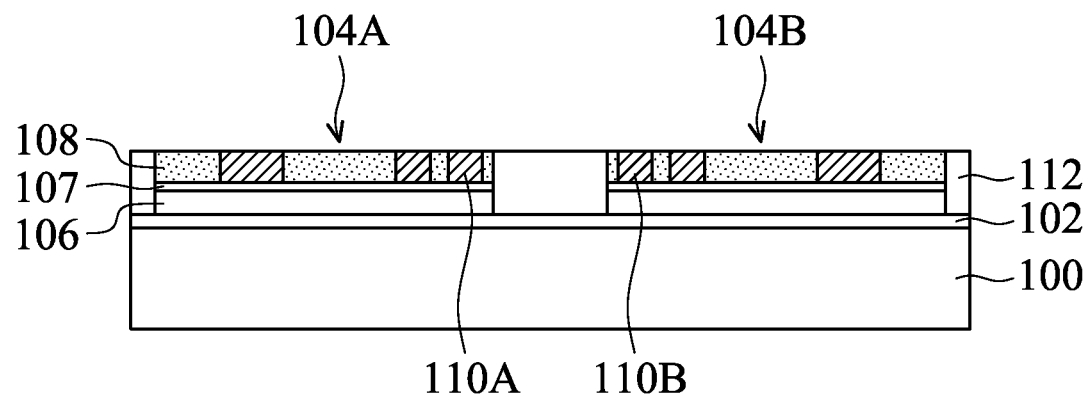

As shown in FIG. 1B, a planarization process is used to thin the protective layer 112, in accordance with some embodiments. As a result, the conductive features 110A and 110B of the semiconductor dies 104A and 104B are exposed. In some embodiments, the top surfaces of the conductive features 110A and 110B are substantially coplanar with the top surface of the protective layer 112 that is thinned. In some embodiments, the top surfaces of the protective layer 112, the passivation layer 108, and the conductive features 110A and 110B are substantially coplanar. The planarization process may include a grinding process, a chemical mechanical polishing (CMP) process, a dry polishing process, an etching process, a cutting process, one or more other applicable processes, or a combination thereof.

Figure 1C:
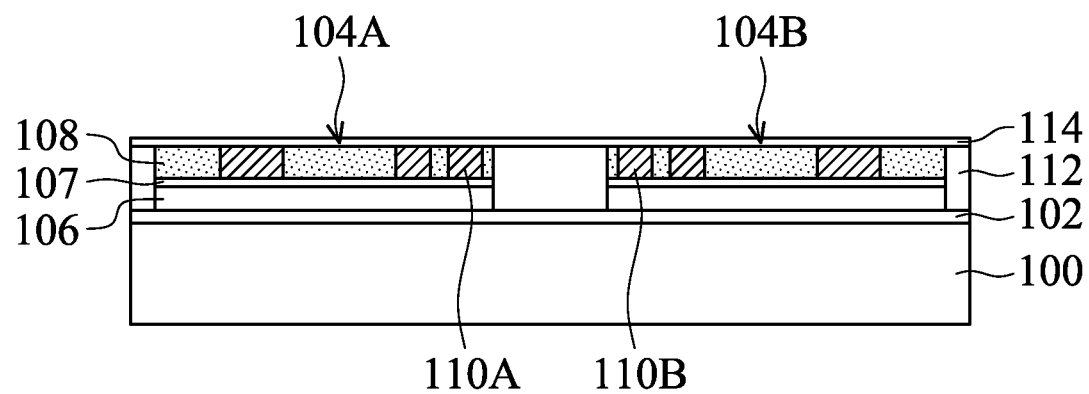

As shown in FIG. 1C, a dielectric layer 114 is formed over the protective layer 112 and the semiconductor dies 104A and 104B, in accordance with some embodiments. The dielectric layer 114 may be used to protect the semiconductor dies 104A and 104B. The conductive features 110A and 110B of the semiconductor dies 104A and 104B are covered by the dielectric layer 114.

The dielectric layer 114 may be made of or include a polymer material. The polymer material includes, for example, polyimide (PI), poly-p-phenylenebenzobisthiazole (PBO), one or more other suitable polymer materials, or a combination thereof. The dielectric layer 114 may be formed using a spin coating process, a spray coating process, one or more other applicable processes, or a combination thereof.

In some other embodiments, the dielectric layer 114 is made of or includes an oxide material (such as silicon oxide), a nitride material (such as silicon nitride), one or more other suitable materials, or a combination thereof. In these cases, the dielectric layer 114 may be deposited using a CVD process, a spin coating process, a spray coating process, one or more other applicable processes, or a combination thereof.

Figure 1D:
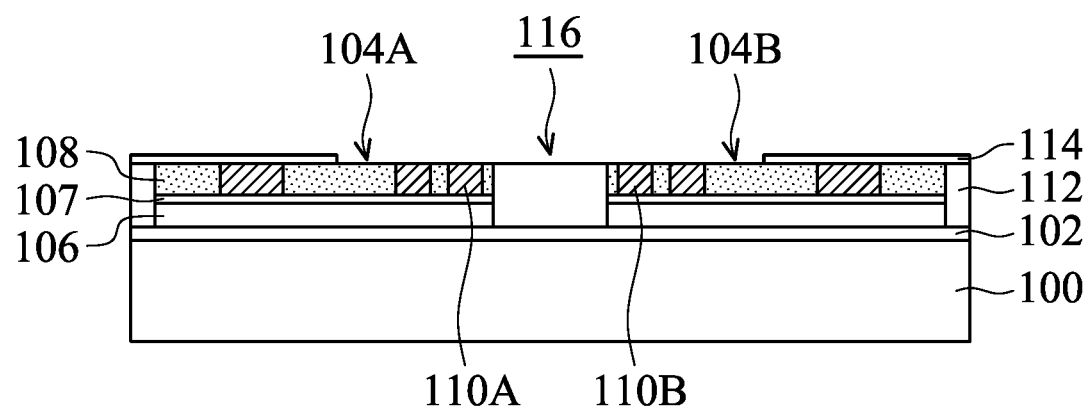

As shown in FIG. 1D, the dielectric layer 114 is patterned to form an opening 116 that partially exposes the semiconductor dies 104A and 104B, in accordance with some embodiments. Some of the conductive features 110A of the semiconductor die 104A are exposed by the opening 116, and some other conductive features 110A are still covered by the dielectric layer 114. Similarly, some of the conductive features 110B of the semiconductor die 104B are exposed by the opening 116, and some other conductive features 110B are still covered by the dielectric layer 114. In some embodiments, a portion of the protective layer 112 between the semiconductor dies 104A and 104B is also exposed by the opening 116, as shown in FIG. 1D.

In some embodiments, the opening 116 is formed using a photolithography process. In some other embodiments, the opening 116 is formed using a photolithography process and an etching process. In some other embodiments, the opening 116 is formed using an energy beam drilling process (such as a laser drilling process or an electron-beam drilling process).

However, embodiments of the disclosure are not limited thereto. Many variations and/or modifications can be made to embodiments of the disclosure. In some other embodiments, the dielectric layer 114 is not formed.

Figure 1E:
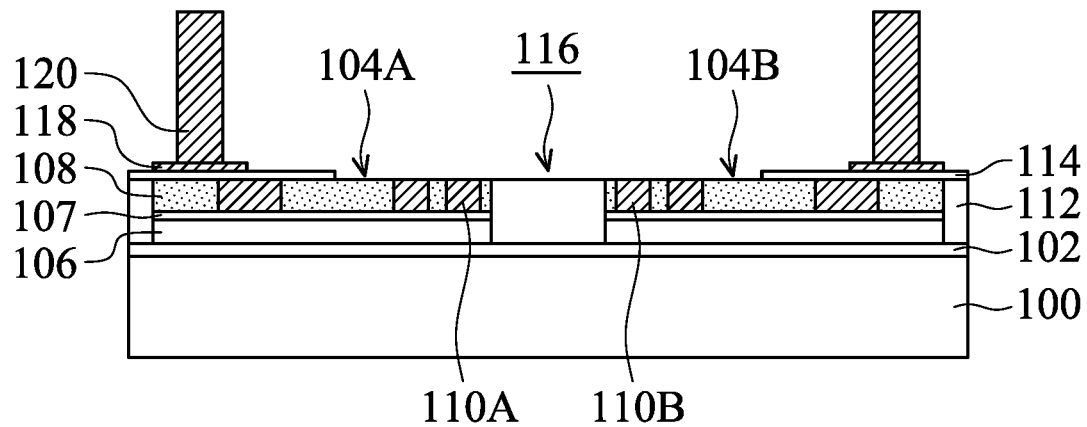

As shown in FIG. 1E, conductive elements 118 and conductive pillars 120 are formed over the dielectric layer 114, in accordance with some embodiments. The conductive elements 118 may function as under bump metallization (UBM) structures and/or redistribution layers. In some embodiments, the conductive pillars 120 include vertical sidewalls. The conductive elements 118 and the conductive pillars 120 may be made of or include copper, cobalt, nickel, titanium, gold, platinum, one or more other suitable materials, or a combination thereof. The formation of the conductive elements 118 and the conductive pillars 120 may include an electroplating process, a PVD process, an electroless plating process, one or more other applicable processes, or a combination thereof.

Figure 1F:
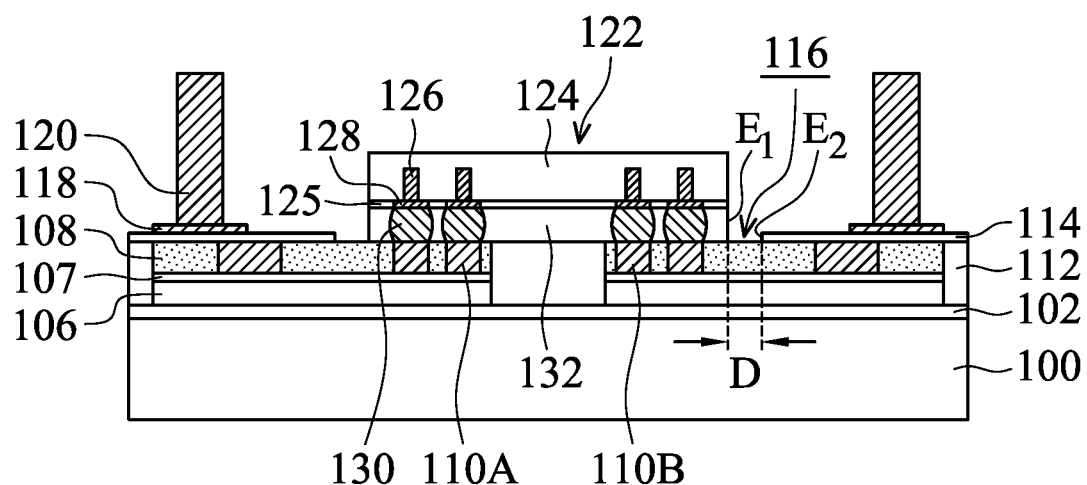

Afterwards, a semiconductor die 122 is formed or received, as shown in FIG. 1F in accordance with some embodiments. The semiconductor die 122 may be used to form electrical connections between the semiconductor dies 104A and 104B. The semiconductor die 122 may function as a die-to-die communication medium. In some embodiments, the semiconductor die 122 includes multiple conductive features including conductive lines and conductive vias. Each of these conductive features may electrical connect device elements formed in the semiconductor dies 104A and 104B. The line width or pitch of the conductive features in the semiconductor die 122 may be smaller than about 0.4 µm. The line width or pitch of the conductive features in the semiconductor die 122 may be in a range from about 10 nm to about 0.4 µm. In some other embodiments, the semiconductor die 122 further includes device elements such as transistors. In some other embodiments, the semiconductor die 122 does not include any device element.

FIGS. 2A-2F are cross-sectional views of various stages of a process for forming a package structure, in accordance with some embodiments. In some embodiments, FIGS. 2A-2F shows various stages of a process for forming the semiconductor die 122.

Figure 2A:
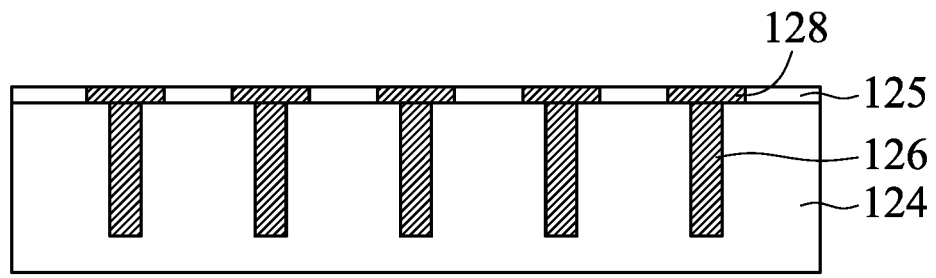
FIGS. 2A-2F are cross-sectional views of various stages of a process for forming a package structure, in accordance with some embodiments.

As shown in FIG. 2A, a semiconductor substrate 124 is provided or received. In some embodiments, the semiconductor substrate 124 is a semiconductor wafer, such as a silicon wafer. In some embodiments, multiple conductive features 126 are formed in the semiconductor substrate 124. In some embodiments, the conductive features extend from the front surface of the semiconductor substrate 124 towards the back surface of the semiconductor substrate 124. The conductive features 126 may serve as conductive vias to provide electrical connections in vertical directions.

The conductive features 126 may be made of or include copper, cobalt titanium, aluminum, tungsten, gold, platinum, nickel, one or more other suitable materials, or a combination thereof. In some embodiments, a photolithography and an etching process are used to form multiple via openings that extend from the front surface towards the back surface of the semiconductor substrate 126. Afterwards, a conductive material layer is deposited over the front surface to fill the via openings. The conductive material layer may be deposited using a PVD process, a CVD process, an electroplating process, an electroless plating process, one or more other applicable processes, or a combination thereof.

Afterwards, a planarization process may be performed to remove the portion of the conductive material layer outside of the via openings. As a result, the remaining portions of the conductive material layer remaining in the via openings form the conductive features 126. The planarization process may include a CMP process, a grinding process, a dry polishing process, an etching process, one or more other applicable processes, or a combination thereof.

In some embodiments, an insulating layer (not shown) is formed between the semiconductor substrate 124 and the conductive features 126. The insulating layer is used to electrically isolate the semiconductor substrate 124 and the conductive features 126. Therefore, any unwanted short circuiting between the conductive features 126 may be prevented. The insulating layer may be made of or include silicon oxide, silicon oxynitride, silicon nitride, germanium oxide, one or more other suitable materials, or a combination thereof.

In some embodiments, the insulating layer is deposited over the sidewalls and bottoms of the via openings before the formation of the conductive material layer. The insulating layer may be deposited using a CVD process, an atomic layer deposition (ALD) process, a PVD process, a thermal oxidation process, one or more other applicable processes, or a combination thereof.

In some embodiments, conductive elements 128 are formed over the conductive features 126, as shown in FIG. 2A. The conductive elements 128 may be used to receive or support subsequently formed conductive bumps. The conductive elements 128 may also be used to form electrical connections between some of the conductive features 126.

In some embodiments, a passivation layer 125 is formed over the front surface of the semiconductor substrate 124, as shown in FIG. 2A. The passivation layer 125 may partially cover the conductive elements 128. In some other embodiments, the top surface of the passivation layer 125 may be substantially coplanar with the top surfaces of the conductive elements 128. The passivation layer 125 may have multiple openings that expose the conductive elements 128. The material and formation method of the passivation layer 125 may be the same as or similar to those of the passivation layer 108 of the semiconductor die 104A or 104B.

Figure 2B:
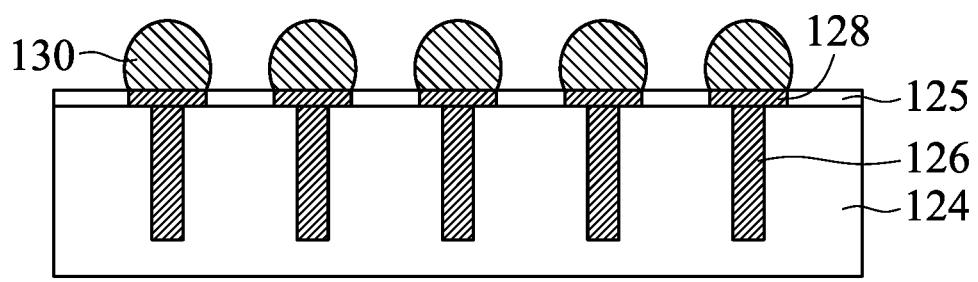

As shown in FIG. 2B, connectors 130 are formed over the conductive elements 128, in accordance with some embodiments. The connectors 130 may include solder bumps. The solder bumps may include an alloy of tin and other metal materials. In some embodiments, the solder bumps are substantially free of lead. In some embodiments, the connectors 130 include metal pillars. The metal pillars may be made of or include copper, cobalt, titanium, aluminum, gold, one or more other suitable materials, or a combination thereof. The metal pillars may include vertical sidewalls.

The formation method of the connectors 130 may involve an electroplating process, an electroless plating process, a PVD process, one or more other applicable processes, or a combination thereof. The formation method of the connectors 130 may further involve a reflow process, an etching process, or other applicable processes. In some embodiments, each of the connectors 130 includes a combination of a solder bump and a metal pillar.

Figure 2C:
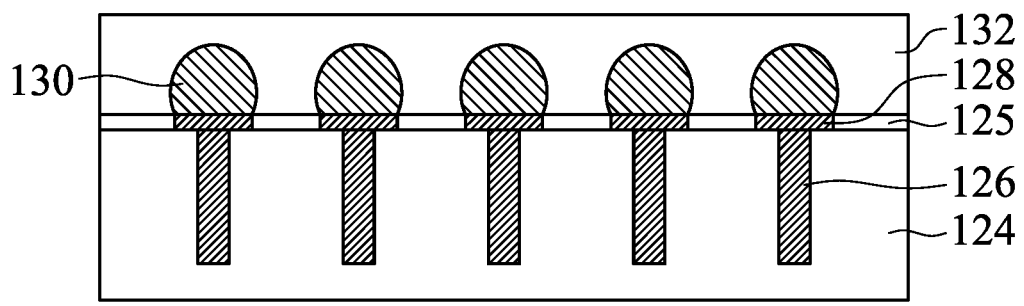

As shown in FIG. 2C, an insulating film (or a non-conductive film) 132 is formed over the semiconductor substrate 124 to cover the connectors 130, in accordance with some embodiments. In some embodiments, the insulating film 132 is made of or includes an epoxy-based resin. Similar to the molding material for forming the protective layer 112, the insulating film 132 is made of or includes an epoxy-based resin with fillers dispersed therein, in accordance with some embodiments. The fillers may include fibers (such as silica fibers), particles (such as silica particles), or a combination thereof. In some embodiments, the insulating film 132 includes a smaller weight percentage of the fillers than that of the protective layer 112. In some embodiments, the insulating film 132 has a weight percentage of the fillers that is in a range from about 20 wt % to about 30 wt %. The protective layer 112 may have a weight percentage of the fillers that is in a range from about 50 wt % to about 60 wt %. In some embodiments, the insulating film 132 is formed over the connectors 130 using a lamination process. In some embodiments, the insulating film 132 is adhesive.

Figure 2D:
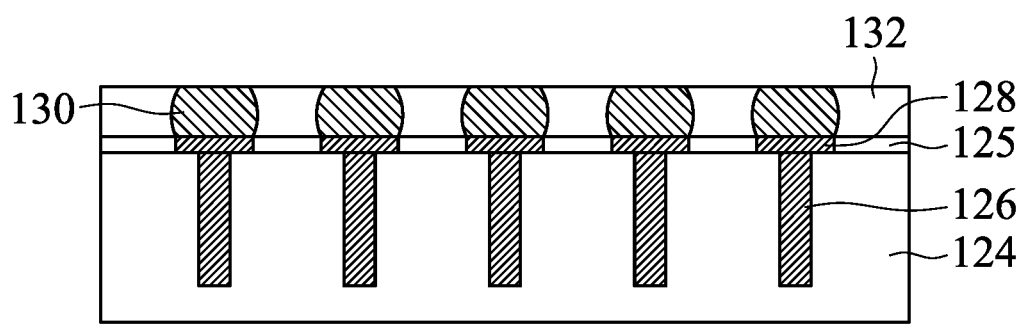

As shown in FIG. 2D, the insulating film 132 is partially removed to expose the connectors 130, in accordance with some embodiments. The exposed connectors 130 may be used to electrically connect the conductive features 110A and 110B of the semiconductor dies 104A and 104B after a subsequent bonding process.

In some embodiments, a thinning process is used to partially remove the insulating film 132. The thinning process may include a cutting process, a grinding process, a dry polishing process, a CMP process, an etching process, one or more other applicable processes, or a combination thereof. In some embodiments, the connectors 130 are also partially removed during the thinning process. In some embodiments, the top surfaces of the connectors 130 are substantially coplanar with the top surface of the insulating film 132 after the thinning process, as shown in FIG. 2D.

Figure 2E:
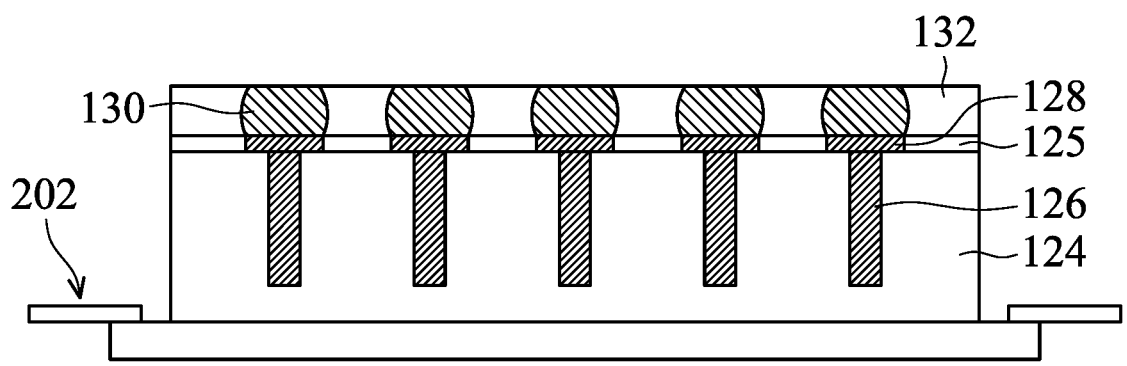

As shown in FIG. 2E, the structure shown in FIG. 2D is attached onto a carrier 202, in accordance with some embodiments. The carrier 202 may be a dicing tape to temporarily adhere the wafer for performing a subsequent dicing process.

Figure 2F:
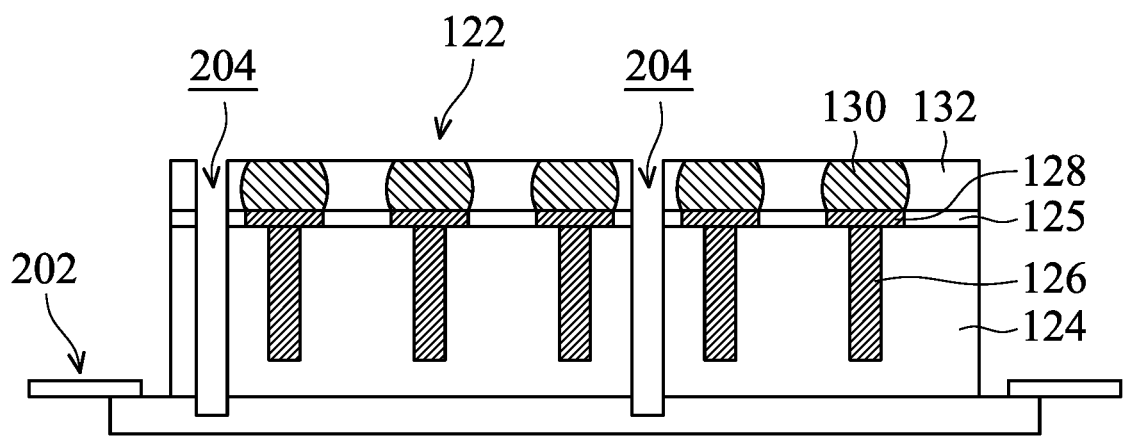

As shown in FIG. 2F, the structure shown in FIG. 2E is diced to form trenches 204, in accordance with some embodiments. A die saw may be used to form the trenches 204. The trenches 204 separate the semiconductor substrate 124 into multiple semiconductor dies 122.

Afterwards, one of the semiconductor dies 122 is picked up and disposed over the semiconductor dies 104A and 104B, as shown in FIG. 1F in accordance with some embodiments. The semiconductor die 122 partially covers the semiconductor dies 104A and 104B. The semiconductor die 122 is bonded with the semiconductor dies 104A and 104B through connectors 130, in accordance with some embodiments. Because the dielectric layer 114 is patterned to expose the conductive features 110A and 110B of the semiconductor dies 104A and 104B, electrical connection between the connectors 130 and the conductive features 110A and 110B of the semiconductor dies 104A and 104B may be formed more easily. In some embodiments, the semiconductor die 122 is bonded with the semiconductor dies 104A and 104B simultaneously.

In some embodiments, some of the connectors 130 are bonded onto and electrically connected to the exposed conductive features 110A of the semiconductor die 104A. Some of the connectors 130 are bonded onto and electrically connected to the exposed conductive features 110B of the semiconductor die 104B. The semiconductor die 122 may function as a communication die to transmit electrical signals between the semiconductor dies 104A and 104B.

In some embodiments, because the opening 116 has a large size, the quality of the patterning process for forming the opening 116 in the dielectric layer 114 is ensured. No residues generated during the patterning process of the dielectric layer 114 is left on the conductive features 110A and 110B, which allows good connection between the connectors 130 and the exposed conductive features 110A and 110B.

In some other cases, smaller openings (such as openings each having a width smaller than about 7 μm) are designed to be formed in the dielectric layer 114 to expose the conductive features 110A and 110B. Because the photolithography process for forming smaller openings is more difficult than that for forming a larger opening, an under-development issue may occur. A portion of the dielectric layer 114 may be under-developed and still be remaining on the surfaces of the conductive features 110A and 110B. As a result, the residues might negatively affect the connection between the connectors 130 and the conductive features 110A and 110B. The performance and reliability of the package structure may be negatively affected.

In some embodiments, the semiconductor die 122 is bonded with the semiconductor dies 104A and 104B using a thermal compression bonding process. In some embodiments, the insulating film 132 is adhesive. Therefore, the semiconductor die 122 is affixed on the semiconductor dies 104A and 104B during the thermal compression bonding process. Due to the adhesion of the insulating film 132, the thermal compression bonding process is facilitated.

In the thermal compression bonding process, a die holder may be used to handle and hold the semiconductor die 122 against the semiconductor dies 104A and 104B. The insulating film 132 also helps to improve adhesion between the semiconductor die 122 and the underlying elements. In the thermal compression bonding process, a compression pressure is applied on the semiconductor die 122 at a high temperature. The applied compression pressure may ensure the connectors 130 to be in direct contact with the conductive features 110A and 110B of the semiconductor dies 104A and 104B. Therefore, the cold-joint issues between the connectors 130 and the conductive features 110A and 110B may be prevented or reduced.

In some embodiments, the operation temperature of the thermal compression bonding process is in a range from about 150 degrees C. to about 350 degrees C. In some embodiments, the applied compression pressure of the thermal compression bonding process is in a range from about 1 MPa to about 100 MPa. However, in some other embodiments, the applied compression pressure and/or the operation temperature are tuned to be in different ranges.

The thermal compression bonding process and the adhesive insulating film 132 may allow the semiconductor die 122 to have a small thickness. The thickness of the semiconductor die 122 may be in a range from about 50 μm to about 150 μm. Due to the small thickness of the semiconductor die 122, a subsequently formed protective layer (such as a molding layer) may also be formed thinner accordingly. Because the amount of the molding material for forming the protective layer is reduced, the warpage of the package structure after a subsequent thermal operation is significantly reduced. The quality and reliability of the package structure are improved.

In some other cases, the thermal compression bonding process and/or the insulating film 132 are/is not used. For example, the semiconductor die 122 is bonded using a reflow process where no additional compression pressure is applied. In these cases, the semiconductor die 122 may need to have a greater thickness (such as greater than 150 μm) to ensure a smooth bonding process and prevent the cold-joint issues since a thicker semiconductor die is easier to be handled than a thinner semiconductor die. However, if the semiconductor die 122 is greater than 150 μm, a large amount of warpage might occur after a subsequent thermal operation since a thicker molding layer may be needed to encapsulate the semiconductor die 122 that is thicker. The quality and reliability of the package structure may be negatively affected. For example, cold-joint issues due to the high warpage might happen.

In some embodiments, the insulating film 132 is not in direct contact with the dielectric layer 114. As shown in FIG. 1F, the insulating film 132 has an edge $E_1$, and the dielectric layer has an edge $E_2$. In some embodiments, the edge $E_1$ is the closet portion of the insulating film 132 to the dielectric layer 114. The edge $E_1$ of the insulating film 132 is separated from the edge $E_2$ of the dielectric layer 114 by a distance D.

The distance D may be in a range from about 2 μm to about 10 μm. In some embodiments, the distance D is the shortest distance between the insulating film 132 and the dielectric layer 114.

Figure 1G:
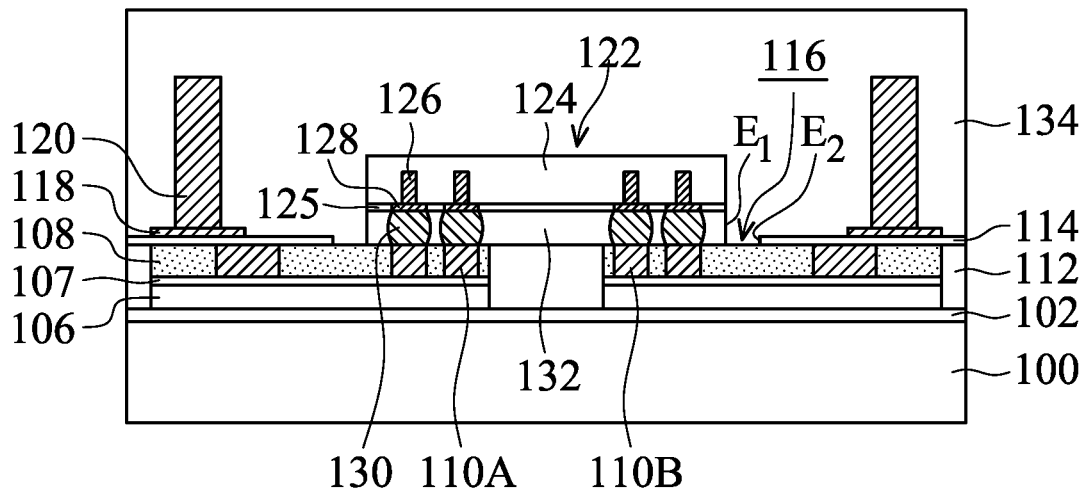

As shown in FIG. 1G, a protective layer 134 is formed to cover the structure shown in FIG. 1F, in accordance with some embodiments. The material and formation method of the protective layer 134 may be the same as or similar to those of the protective layer 112. The insulating film 132 is separated from the dielectric layer 114 by a portion of the protective layer 134, as shown in FIG. 1G in accordance with some embodiments.

Figure 1H:
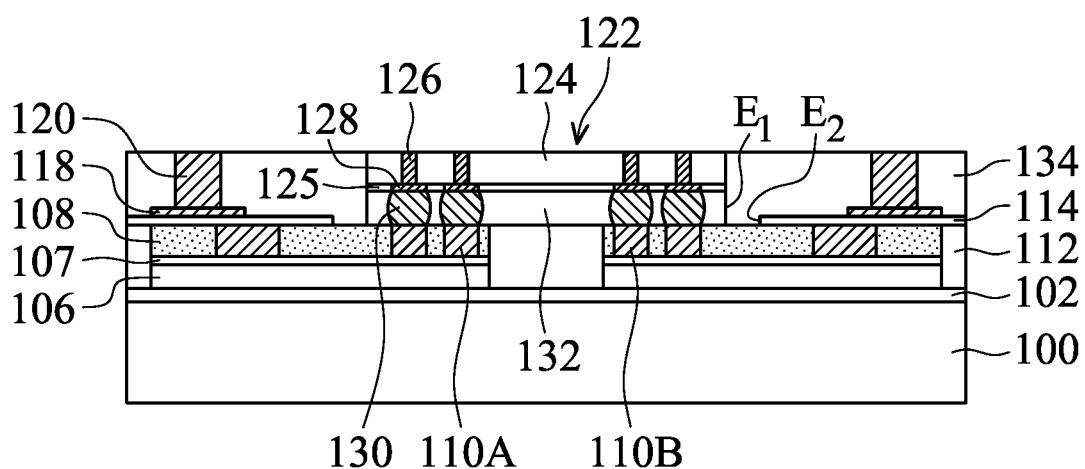

As shown in FIG. 1H, the protective layer 134 is thinned, in accordance with some embodiments. As a result, the conductive pillars 120 are exposed. A planarization process may be used to thin the protective layer 134. The planarization process may include a grinding process, a dry polishing process, a CMP process, a cutting process, an etching process, one or more other applicable processes, or a combination thereof.

In some embodiments, the planarization process further remove a portion of the conductive pillars 120 and a portion of the semiconductor die 122. The semiconductor substrate 124 of the semiconductor die 122 is partially removed. As a result, conductive features 114 formed in the semiconductor die 122 are also exposed. The conductive features 114 may function as through substrate vias (TSVs).

Figure 1I:
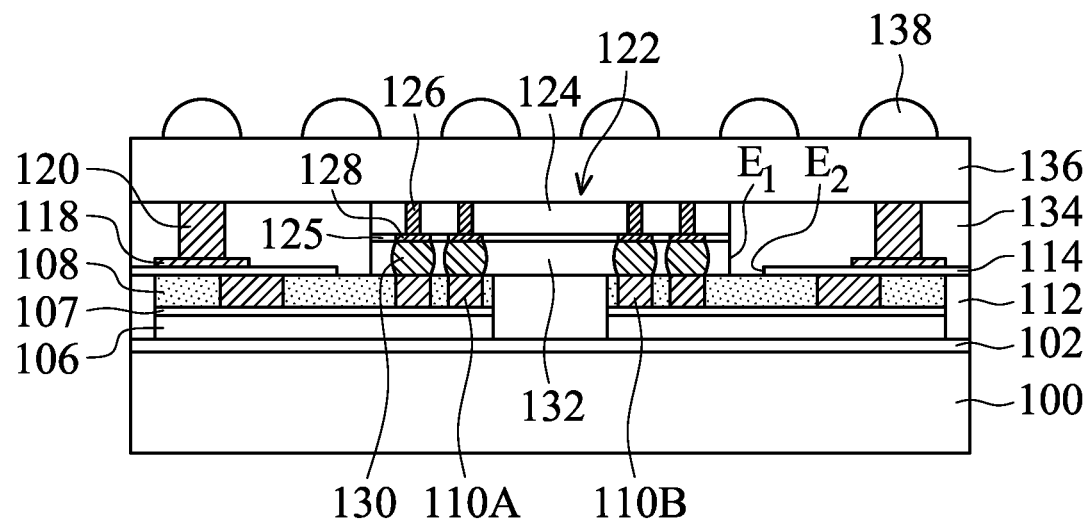

As shown in FIG. 1I, a redistribution structure 136 is formed over the structure shown in FIG. 1H, in accordance with some embodiments. The redistribution structure 136 may include multiple dielectric layers and multiple conductive features formed between the dielectric layers. The conductive features include conductive vias and conductive lines. Some of the conductive features are electrically connected to the conductive pillars 120. Some of the conductive features are electrically connected to the conductive features 114 of the semiconductor die 122.

The dielectric layers of the redistribution structure 132 may be made of or include PBO, PI, silicon oxide, one or more other suitable materials, or a combination thereof. The conductive features of the redistribution structure 132 may be made of or include copper, aluminum, cobalt, titanium, gold, platinum, one or more other suitable materials, or a combination thereof. The formation of the redistribution structure 132 may involve multiple coating (or deposition) processes, photolithography processes, and/or etching processes.

Afterwards, conductive bumps 138 are formed over the redistribution structure 136, as shown in FIG. 1I in accordance with some embodiments. The conductive bumps 138 may include solder bumps, metal pillars, one or more other suitable conductive elements, or a combination thereof. The solder bumps may include an alloy of tin and other metal materials. In some embodiments, the solder bumps is substantially free of lead. The metal pillars may be made of or include copper, cobalt, titanium, aluminum, gold, one or more other suitable materials, or a combination thereof. The metal pillars may include vertical sidewalls. The formation method of the conductive bumps 138 may involve an electroplating process, an electroless plating process, a PVD process, one or more other applicable processes, or a combination thereof. The formation method of the conductive bumps 138 may further involve a reflow process, an etching process, or other applicable processes.

Figure 1J:
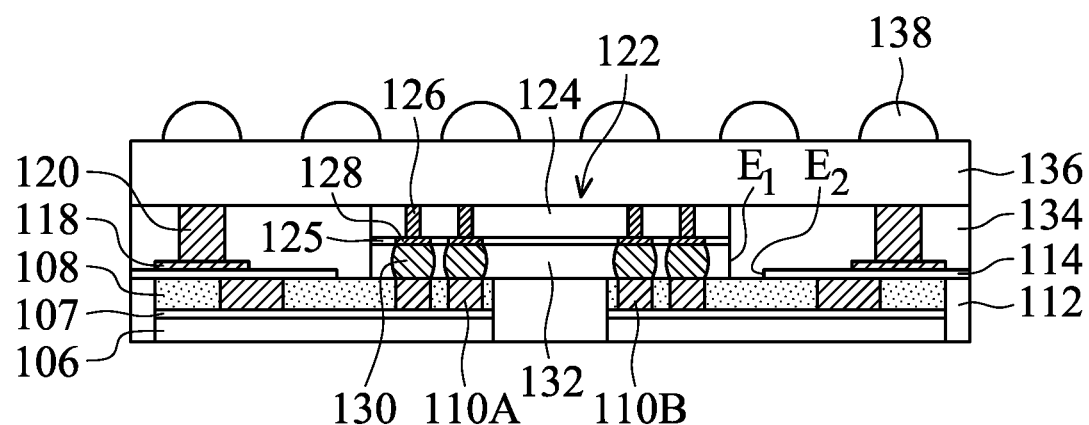

As shown in FIG. 1J, the carrier substrate 100 is removed, in accordance with some embodiments. As a result, a package structure is formed. The package structure may be integrated with other structures. For example, the package structure may be bonded onto a printed circuit board, a redistribution substrate, an interposer substrate, or another package structure. In some other embodiments, another redistribution structure is formed over the back surfaces of the protective layer 112 and the semiconductor dies 104A and 104B.

Figure 3:
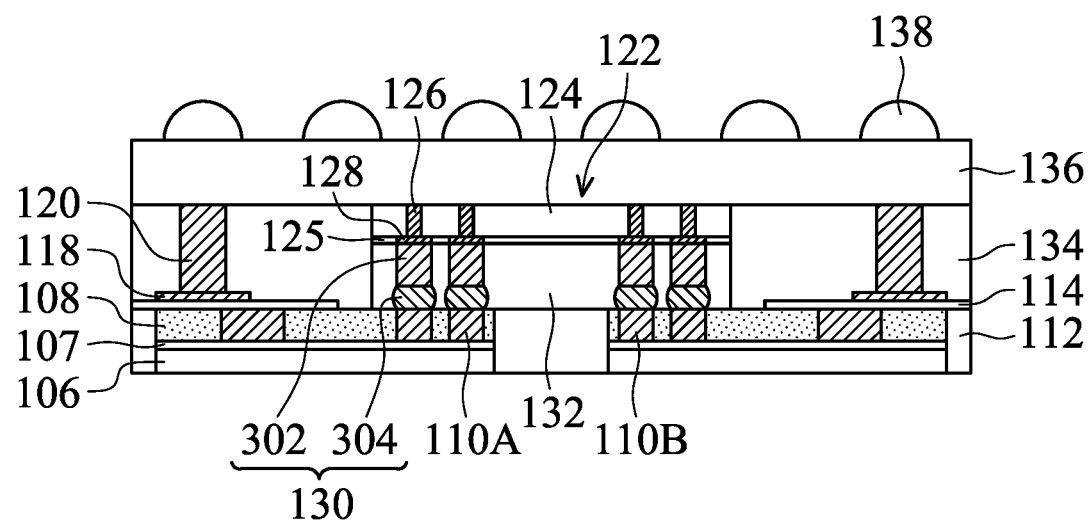
FIG. 3 is a cross-sectional view of a package structure, in accordance with some embodiments.

Many variations and/or modifications can be made to embodiments of the disclosure. FIG. 3 is a cross-sectional view of a package structure, in accordance with some embodiments. In some embodiments, each of the connectors 130 includes a metal pillar 302 and a solder element 304. The material and formation method of the metal pillar 302 may be the same as or similar to those of the conductive pillars 120. The solder element 304 may include an alloy of tin and other metal materials. In some embodiments, the solder bumps is substantially free of lead.

Figure 4A:
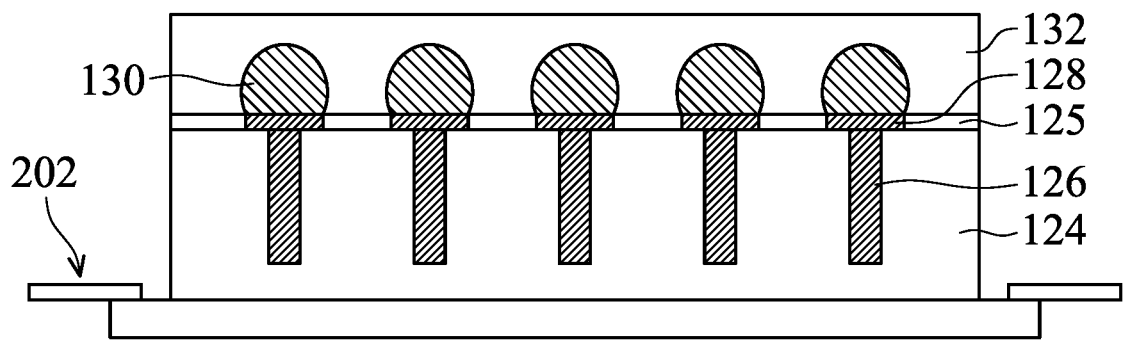
FIGS. 4A-4B are cross-sectional views of various stages of a process for forming a package structure, in accordance with some embodiments.
Figure 4B:
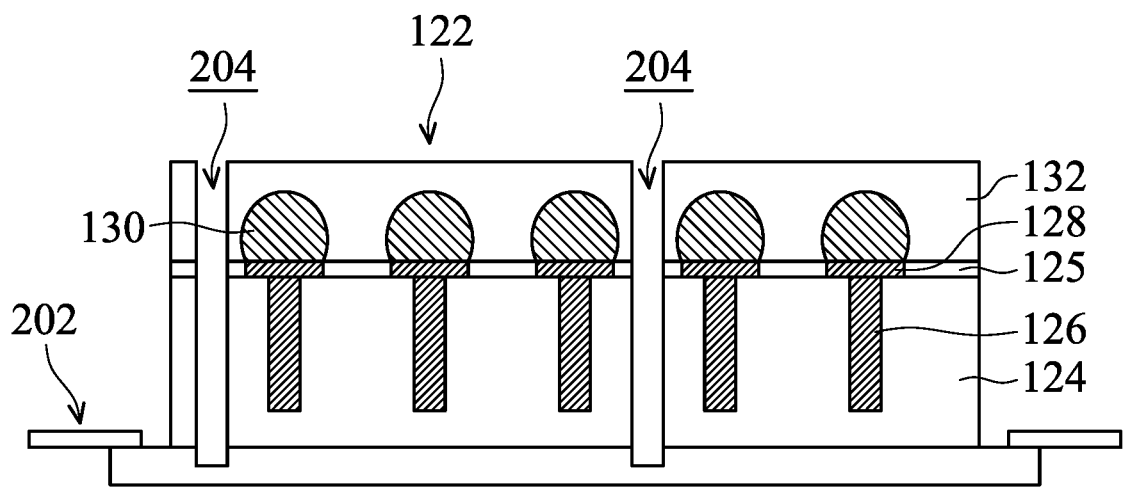

As illustrated in the embodiments shown in FIGS. 2C-2F and 1F, the insulating film 132 is partially removed before the semiconductor die 122 is bonded onto the semiconductor dies 104A and 104B. However, embodiments of the disclosure are not limited thereto. Many variations and/or modifications can be made to embodiments of the disclosure. FIGS. 4A-4B are cross-sectional views of various stages of a process for forming a package structure, in accordance with some embodiments.

As shown in FIG. 4A, a structure the same as or similar to the structure shown in FIG. 2C is attached onto the carrier 202, in accordance with some embodiments. The insulating film 132 is not partially removed. Therefore, the connectors 130 are covered by the insulating film 132.

As shown in FIG. 4B, the structure shown in FIG. 4A is diced to form trenches 204, in accordance with some embodiments. The trenches 204 separate the semiconductor substrate 124 into multiple semiconductor dies 122.

Figure 5A:
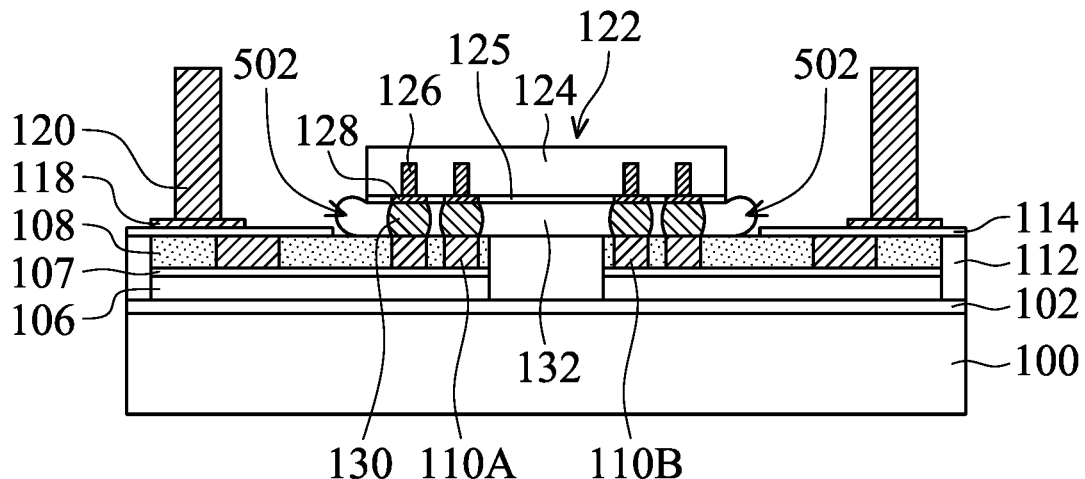
FIGS. 5A-5B are cross-sectional views of various stages of a process for forming a package structure, in accordance with some embodiments.
Figure 5B:
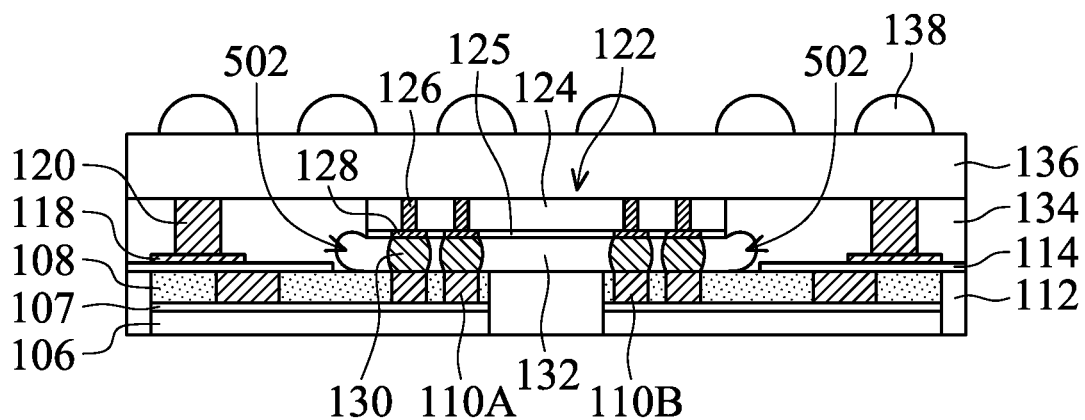

FIGS. 5A-5B are cross-sectional views of various stages of a process for forming a package structure, in accordance with some embodiments. As shown in FIG. 5A, one of the semiconductor dies 122 shown in FIG. 4B is picked up and disposed over the semiconductor dies 104A and 104B, in accordance with some embodiments. The semiconductor die 122 is bonded with the semiconductor dies 104A and 104B through the connectors 130, in accordance with some embodiments.

In some embodiments, the semiconductor die 122 is bonded onto the semiconductor dies 104A and 104B using a thermal compression bonding process. As mentioned above, a compression pressure is applied on the semiconductor die 122 during the thermal compression bonding process. In some embodiments, due to the compression pressure, the connectors 130 penetrate through the insulating film 132 to be in direct contact with the conductive features 110A and 110B of the semiconductor dies 104A and 104B. In some embodiments, a portion of the insulating film 132 is squeezed beyond an edge of the semiconductor die 122 due to the compression pressure applied during the thermal compression bonding process.

As shown in FIG. 5A, after bonding the semiconductor die 122 to the semiconductor dies 104A and 104B, one (or more) squeezed portion 502 of the insulating film 132 are formed, in accordance with some embodiments. The squeezed portion 502 extends beyond an edge of the semiconductor substrate 124 of the semiconductor die 122. In some embodiments, the squeezed portion 502 has a sidewall surface that curve outwards with respect to an inner portion of the squeezed portion 502, as shown in FIG. 5A.

In some embodiments, the insulating film 132 has multiple squeezed portions 502, as shown in FIG. 5A. In some embodiments, each of the squeezed portions 502 has a sidewall surface that curve outwards with respect to an inner portion of the squeezed portion 502. In some embodiments, a top surface of the squeezed portion 502 is higher than an interface between the insulating film 132 and the passivation layer 125 of the semiconductor die 122. In some embodiments, the squeezed portion 502 is separated from the dielectric layer 114 by a distance. The squeezed portion 502 is not in direct contact with the dielectric layer 114.

Afterwards, processes that are the same as or similar to those illustrated in FIGS. 1G-1J are performed to form a package structure, as shown in FIG. 5B in accordance with some embodiments. In some embodiments, the squeezed portion 502 of the insulating film 132 is separated from the dielectric layer 114 by a portion of the protective layer 134.

Figure 6:
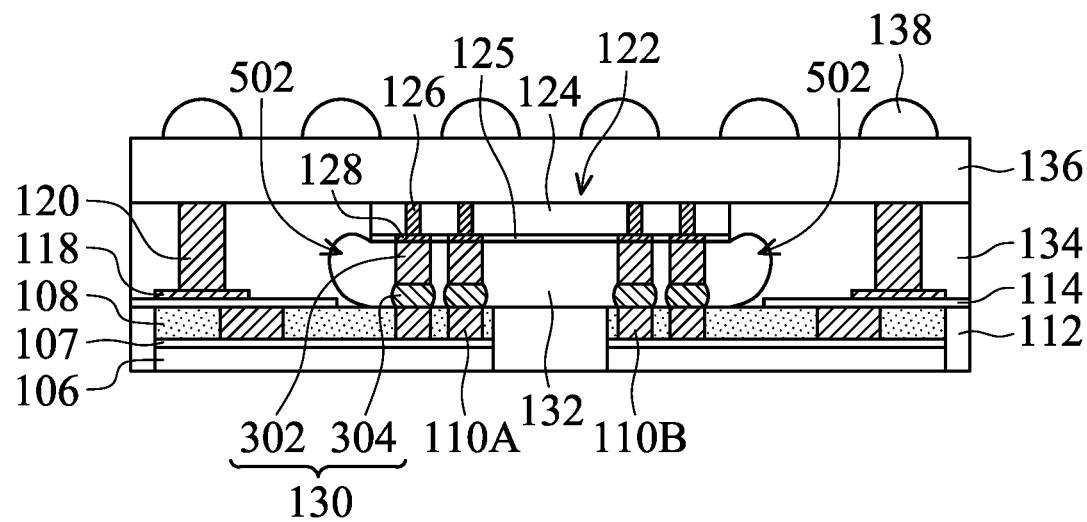
FIG. 6 is a cross-sectional view of a package structure, in accordance with some embodiments.

Many variations and/or modifications can be made to embodiments of the disclosure. FIG. 6 is a cross-sectional view of a package structure, in accordance with some embodiments. FIG. 6 shows a structure similar to that illustrated in FIG. 5B. In some embodiments, each of the connectors 130 includes the metal pillar 302 and the solder element 304. The material and formation method of the metal pillar 302 may be the same as or similar to those of the conductive pillars 120. The solder element 304 may include an alloy of tin and other metal materials. In some embodiments, the solder bumps is substantially free of lead.

Figure 7:
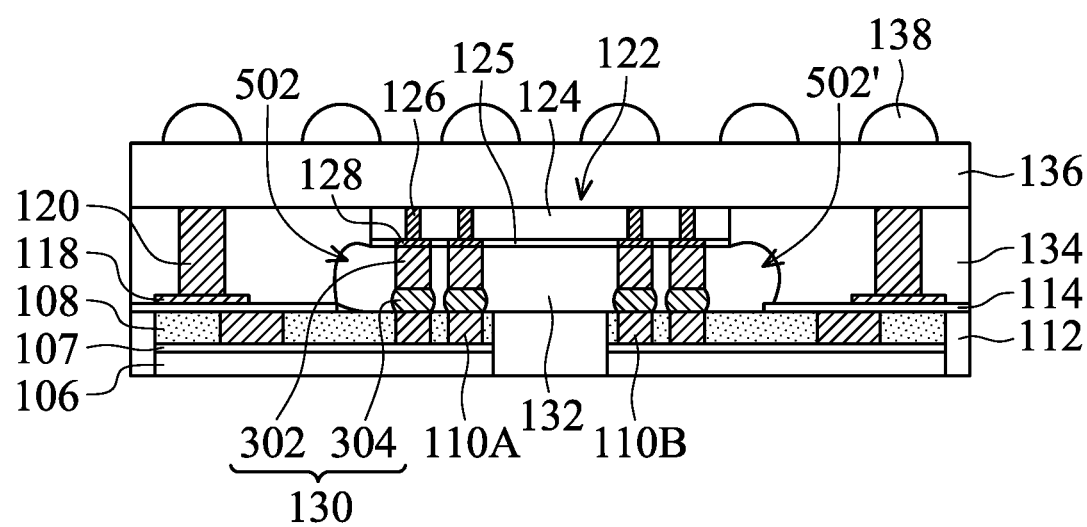
FIG. 7 is a cross-sectional view of a package structure, in accordance with some embodiments.

Many variations and/or modifications can be made to embodiments of the disclosure. FIG. 7 is a cross-sectional view of a package structure, in accordance with some embodiments. In some embodiments, the squeezed portion 502 of the insulating film 132 not only extends beyond the edge of the semiconductor die 122 but also comes in contact with the dielectric layer 114. That is, the squeezed portion 502 of the insulating film 132 is in direct contact with the dielectric layer 114, in accordance with some embodiments.

In some embodiments, the squeezed portion 502 of the insulating film 132 is in direct contact with an edge of the dielectric layer 114. In some embodiments, a portion of the protective layer 134 is between the squeezed portion 502 and the dielectric layer 114 even if the squeezed portion 502 is in direct contact with an edge of the dielectric layer 114, as shown in FIG. 7.

As shown in FIG. 7, the insulating film 132 also includes a squeezed portion 502'. In some embodiments, the squeezed portion 502' extends beyond an edge of the dielectric layer 114. In some embodiments, the squeezed portion 502' partially covers a top surface of the dielectric layer 114. In some embodiments, the squeezed portion 502' is in direct contact with the top surface and the edge of the dielectric layer 114.

Embodiments of the disclosure form a package structure with stacked semiconductor dies. A thermal compression bonding process is used to bond an upper semiconductor die onto lower semiconductor dies. Due to the characteristics of the thermal compression bonding process, the upper semiconductor die is allowed to have a small thickness without raising the cold-joint issue. Therefore, a subsequently formed protective layer (such as a molding layer) used to surround the upper semiconductor die may also have a small thickness, which significantly reduce the warpage of the package structure. Before the thermal compression bonding process, a large opening partially exposes the lower semiconductor dies is formed in a dielectric layer on the lower semiconductor dies. The photolithography process for forming the large opening is easier to perform. No residue is left on conductive features of the lower semiconductor dies. The under-development issue may thus be prevented. Accordingly, the electrical connections between the upper semiconductor die and the lower semiconductor dies are improved. The quality and reliability of the package structure are greatly improved.

In accordance with some embodiments, a method for forming a package structure is provided. The method includes disposing a first semiconductor die over a carrier substrate and forming a first protective layer to surround the first semiconductor die. The method also includes forming a dielectric layer over the first protective layer and the first semiconductor die. The method further includes patterning the dielectric layer to form an opening partially exposing the first semiconductor die and the first protective layer. In addition, the method includes bonding a second semiconductor die to the first semiconductor die after the opening is formed. The method further includes forming a second protective layer to surround the second semiconductor die.

In accordance with some embodiments, a method for forming a package structure is provided. The method includes forming a first protective layer to surround a first semiconductor die and a second semiconductor die. The method also includes forming a dielectric layer to cover the first semiconductor die, the second semiconductor die, and the first protective layer. The method further includes forming an opening in the dielectric layer, and the opening partially exposes the first semiconductor die, the second semiconductor die, and the first protective layer. In addition, the method includes disposing a third semiconductor die to partially cover the first semiconductor die and the second semiconductor die after the opening is formed. The third semiconductor die forms electrical connections between the first semiconductor die and the second semiconductor die. The method further includes forming a second protective layer to surround the third semiconductor die.

In accordance with some embodiments, a package structure is provided. The package structure includes a lower semiconductor die and a first protective layer surrounding the lower semiconductor die. The package structure also includes a dielectric layer partially covering the first protective layer and the lower semiconductor die. The package structure further includes an upper semiconductor die over the lower semiconductor die and the first protective layer. The upper semiconductor die is bonded with the lower semiconductor die through a connector. In addition, the package structure includes an insulating film surrounding the connector and a second protective layer surrounding the upper semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a lower semiconductor die;
   a first protective layer surrounding the lower semiconductor die;

a dielectric layer partially covering the first protective layer and the lower semiconductor die;

an upper semiconductor die over the lower semiconductor die and the first protective layer, wherein the upper semiconductor die is bonded with the lower semiconductor die through a connector;

an insulating film surrounding the connector; and a second protective layer surrounding the upper semiconductor die, wherein a portion of the second protective layer is between the insulating film and the dielectric layer.

2. The package structure as claimed in claim 1, wherein the insulating film comprises a squeezed portion extending beyond an edge of the upper semiconductor die, and the squeezed portion has a sidewall surface curved outwards with respect to an inner portion of the squeezed portion.

3. The package structure as claimed in claim 2, wherein the squeezed portion is separated from the dielectric layer by a portion of the second protective layer.

4. The package structure as claimed in claim 2, wherein the squeezed portion is in direct contact with the dielectric layer.

5. The package structure as claimed in claim 4, wherein the insulating film is separated from the dielectric layer by a portion of the second protective layer.

6. The package structure as claimed in claim 1, wherein the lower semiconductor die has an edge laterally between opposite edges of the upper semiconductor die.

7. The package structure as claimed in claim 1, wherein the insulating film is in direct contact with the lower semiconductor die.

8. The package structure as claimed in claim 1, wherein the insulating film is in direct contact with the first protective layer.

9. The package structure as claimed in claim 1, wherein edges of the insulating film and the upper semiconductor die are substantially aligned with each other.

10. The package structure as claimed in claim 1, further comprising:

a second lower semiconductor die surrounded by the first protective layer, wherein the upper semiconductor die is bonded with the second lower semiconductor die through a second connector, and the insulating film surrounds the second connector.

11. A package structure, comprising:

a lower semiconductor die;

a first protective layer surrounding the lower semiconductor die;

an upper semiconductor die over the lower semiconductor die and the first protective layer, wherein the upper semiconductor die is bonded with the lower semiconductor die through a connector;

an insulating film surrounding the connector; and a second protective layer surrounding the upper semiconductor die and the insulating film, wherein the insulating film is in direct contact with the first protective layer and the second protective layer.

12. The package structure as claimed in claim 11, wherein the upper semiconductor die extends across an edge of the lower semiconductor die.

13. The package structure as claimed in claim 11, wherein edges of the insulating film and the upper semiconductor die are substantially aligned with each other.

14. The package structure as claimed in claim 11, wherein the insulating film comprises a squeezed portion extending beyond an edge of the upper semiconductor die.

15. The package structure as claimed in claim 11, wherein a portion of the second protective layer is below the squeezed portion of the insulating film and above the lower semiconductor die.

16. A package structure, comprising:

a lower semiconductor die;

a first protective layer surrounding the lower semiconductor die;

an upper semiconductor die over the lower semiconductor die and the first protective layer, wherein the upper semiconductor die is bonded with the lower semiconductor die through a connector;

an insulating film surrounding the connector, wherein the insulating film comprises a squeezed portion extending beyond an edge of the upper semiconductor die, and the squeezed portion has a sidewall surface curved outwards with respect to an inner portion of the squeezed portion; and a second protective layer surrounding the upper semiconductor die.

17. The package structure as claimed in claim 16, wherein a portion of the second protective layer is below the squeezed portion of the insulating film and above the lower semiconductor die.

18. The package structure as claimed in claim 16, wherein the insulating film is in direct contact with the first protective layer.

19. The package structure as claimed in claim 16, wherein the first protective layer is substantially as thick as the lower semiconductor die.

20. The package structure as claimed in claim 16, further comprising:

a second lower semiconductor die surrounded by the first protective layer, wherein the insulating film partially covers the second lower semiconductor die.

* * * * *